United States Patent [19]

Furman

[11] 4,264,832
[45] Apr. 28, 1981

[54] FEEDBACK AMPLIFIER
[75] Inventor: Anatol Furman, Fairfax, Vt.
[73] Assignee: IBM Corporation, Armonk, N.Y.
[21] Appl. No.: 29,590
[22] Filed: Apr. 12, 1979
[51] Int. Cl.³ .............................................. H03K 5/24
[52] U.S. Cl. .................................... 307/355; 330/254; 330/260
[58] Field of Search ......... 307/238, 355, 362, DIG. 3; 330/260, 254

[56] References Cited

U.S. PATENT DOCUMENTS

| | | | |
|---|---|---|---|
| 3,621,301 | 11/1971 | Tomczak | 307/290 |
| 3,745,539 | 7/1973 | Davidson et al. | 307/238 X |
| 3,899,777 | 8/1975 | Feicht et al. | 307/238 X |
| 4,027,176 | 5/1977 | Heuber et al. | 307/355 |

OTHER PUBLICATIONS

N. M. Donofrio et al., "Differential Shunt Feedback Sense Amplifier" IBM Technical Disclosure Bulletin, vol. 12, No. 12 May 1970, p. 2123.

*Primary Examiner*—John Zazworsky
*Attorney, Agent, or Firm*—Francis J. Thornton

[57] ABSTRACT

This is a feedback amplifier incorporating shunt feedback pairs which are emitter coupled for differential input transimpedance configuration whose characteristic includes a low differential input impedance and a high common load impedance that uses low input offset voltages to initiate the amplification and a latch coupled thereto to latch and amplify the amplifier input causing the effective amplifier input to be several orders of magnitude greater than the initial offset voltages. Thus, the amplifier of the invention uses the latch to not only sense the output of the amplifier but also the drive and reinforce the amplifier input through feedback.

6 Claims, 1 Drawing Figure

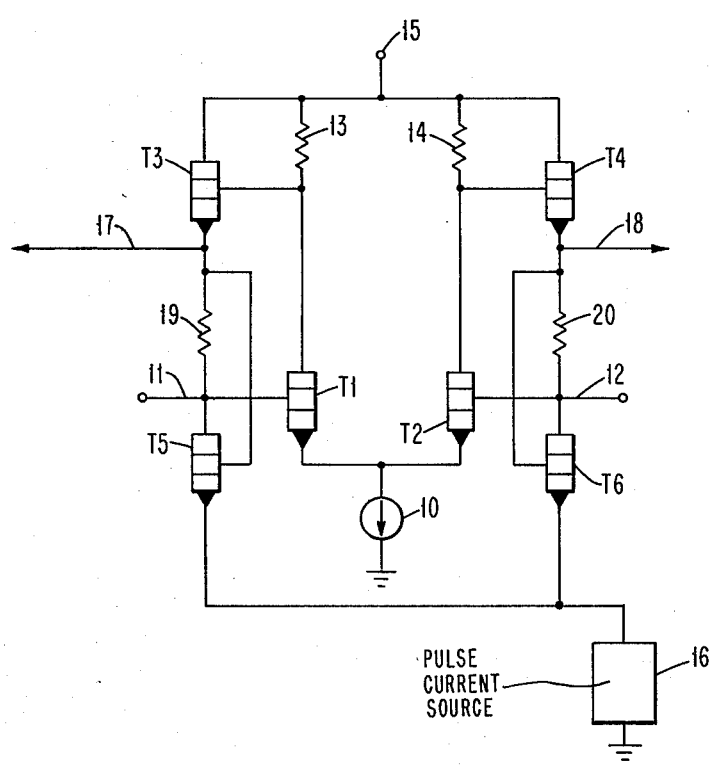

FEEDBACK AMPLIFIER

BACKGROUND OF THE INVENTION

1. Field of the Invention

This invention relates to sense amplifier circuits and more particularly to a sense amplifier circuit in which there is provided a positive latching feedback to the input of the amplifier to latch on the amplifier input and the gain in the amplifier.

2. Description of the Prior Art

Negative feedback differential amplifiers are well known in the prior art. The IBM Technical Disclosure Bulletin, Vol. 12, #12, May 1970, shows a basic negative feedback differential amplifier. Such an amplifier essentially consists of two current sense shunt feedback amplifiers connected to a differential configuration such that current input signals on the sense line are amplified and fed through the negative feedback transistor to the output. The feedback resistors between the output and the inputs of the amplifier are chosen so that the gain on the feedback amplifier is sufficient to trigger a detector circuit when a signal appears at either input. Variations on this basic differential negative feedback amplifier are also shown in U.S. Pat. No. 3,899,777.

U.S. Pat. No. 3,745,539 also discloses still another latching negative feedback amplifier.

U.S. Pat. No. 4,027,176 teaches a sense circuit in which an output is detected by a differential amplifier controlling a latch with feedback.

U.S. Pat. No. 3,621,301 teaches a special responsive negative latching circuit used in positive feedback.

Generally, in differential sense amplifiers, error signals occur because of structural differences in the individual amplifiers which are coupled together.

Thus structural differences in the differential amplifiers cause an asymmetry which cannnot be avoided so that a differential current independent of the actual current at the input of the read amplifier flows and the output of such amplifier is a function not only of the amplified input signals but the amplified error signals as well. Moreover since such amplifiers are usually used in a cascade arrangement, i.e., the output of a first amplifier is coupled into the inputs of a second amplifier, any error signal is not only amplified within the amplifier itself but is also further amplified in the subsequent amplifiers through which it passes.

SUMMARY OF THE INVENTION

It is thus the object of the present invention to describe the use of a simple low gain, small window, positive feedback amplifier used as a pulse prediscriminator to upgrade an existing amplifier.

It is a further object of the invention to describe a low gain amplifier that uses low input offset voltages to initiate the amplification and a latch coupled thereto to latch and amplify the amplifier input causing the effective amplifier input to be several orders of magnitude greater than the initial offset voltages.

It is also an object of the invention to set forth an amplifier which provides the required output current by using two separate current producing functions.

It is still another object of the invention to describe a latched amplifier which uses the latch to not only sense the output of the amplifier but also to drive and reinforce the amplifier input.

The invention is directed toward a feedback amplifier incorporating shunt feedback pairs which are emitter coupled for a differential input transimpedance configuration whose characteristics include a very low differential input impedance and a very high common mode impedance.

It is another object of this invention to provide a positive feedback discriminator element used as a pulse prediscriminator to upgrade an existing amplifier.

It is further an object of this invention to provide an element at a low gain in an amplifier which can be pulsed such that the element provides an artifical signal to amplify the input signal.

BRIEF DESCRIPTION OF THE DRAWING

The FIGURE shows a differential shunt feedback sense amplifier incorporating the present invention.

DETAILED DESCRIPTION OF THE INVENTION

Referring now to the drawing there is shown in the FIGURE a differential shunt feedback sense amplifier comprising two sets of current mode sense amplifiers T1 and T2, and T3 and T4 respectively, each set of which is connected in differential configuration.

Input transistors T1 and T2 are an emitter coupled transistor switch pair with respective input sense lines 11 and 12. Thus transistor T1 has its base connected to the sense line 11 with its emitter coupled to the emitter of transistor T2 and to a common current source 10 and its collector connected to the base of an emitter follower transistor T3 and through a resistor 13 to a positive voltage source 15. Transistor T2, besides having its emitter coupled to the emitter of transistor T1 and to the current source 10, has its base coupled to the input sense line 12 and its collector connected to the base of the emitter follower transistor T4 and through a resistor 14 to the positive voltage source 15.

The emitter follower transistor T3 has its collector coupled to the voltage source 15 and its emitter coupled to an output line 17 and through a resistor 19 to the input line 11. The emitter of transistor T3 is also coupled to the base of a latch transistor T5. Similarly, the emitter follower transistor T4 has its collector coupled to the voltage source 15 and its emitter coupled to an output line 18 and through a resistor 20 to the input line 12. The emitter of transistor T4 is also coupled to the base of a second latch transistor T6.

The latch transistor T5 has its collector coupled to the input sense line 11 and its emitter coupled to a pulsed current source 16. The latch transistor T6 has its collector connected to the input sense line 12 and its emitter coupled to the emitter of transistor T5 and to the pulsed current source 16.

The operation of this described amplifier is as follows: differential signals sensed on the input lines 11 and 12 are amplified by input transistors T1 and T2 and fed through the emitter follower transistors T3 and T4 to the output lines 17 and 18 respectively. The feedback resistors 19 and 20 are chosen so that the gain on the shunt feedback amplifiers is sufficient to trigger a detection circuit with the voltage difference between the output lines 17 and 18 when a differential signal appears at the input terminals. It will be assumed, for example, that the incoming differential signal is such that the sense line 11 is pulled down and the sense line 12 is pulled up. As the input line 11 is pulled down the base of transistor T1 is also pulled down causing transistor T1 to begin to turn off and reduce the current flowing therethrough. As the current flow through transistor T1 decreases, the base of transistor T3 becomes more positive and transistor T3 turns on and pulls up the output line 17 and the base of the latch transistor T5. Simultaneously line 12 is being pulled up, i.e. made positive with respect to line 11, causing transistor T2 to turn on and draw more current through resistor 14 from voltage source 15 and pull down the base voltage of the emitter follower transistor T4. As the base drive of transistor T4 falls off, the level of the output line 18 and the base of transistor T6 also falls off.

Because the output line 17 is now more positive than the input line 11, a differential voltage appears across the resistor 19 and current is drawn through the transistor T5 when current source 16 is pulsed on lowering the collector voltage of the transistor T5 and hence pulling line 11 still more negative. Simultaneously because transistor T4 is turning off transistor T6 is also shutting off and its collector now rises and becomes more positive causing the base of transistor T2 and the input line 12 to become even more positive. This action latches the input lines 11 and 12 into the state initiated by the input sense signals. Thus positive feedback is realized. In addition this latching action also amplifies the input signals appearing on the respective sense lines 11 and 12. Thus for example, if one microamp differential current is initially imposed on the input lines 11 and 12 and the current source 16, is a sink for 200 microamps, when the feedback latching circuit, via transistors T5 and T6, becomes operational an apparent input signal of 201 microamps differential is applied to the bases of the input transistors T1 and T2.

Because the basic feedback amplifier comprising transistors T1, T3 and T2 and T4, invert the input signal with regard to the respective output line, i.e., if input line 11 is negative the output line 17 is positive. The latching transistors T5 and T6 need not be cross coupled but need to be coupled directly to the respective input and output lines. Thus the latching transistors T5 and T6 not only latch on the input signal but further amplify it so that transistors T1 and T2 become more firmly fixed in the state initially set by the incoming input signal.

Because only a few millivolts of differential signal between output lines 17 and 18 are sufficient to cause the latch transistors T5 and T6 to take a latch state, the input signal and the gain of the amplifier need not be large. When transistors T5 and T6 latch, the current of the pulsed current source 16 is added to the signal, and in phase with it. Since the magnitude of the pulsed current source 16 is an independant parameter not related to amplifier gain or input signal, this current may be separately adjusted to give the required logic signal output swing, independently of amplifier gain or input signal level. Thus, the latch transistors T5 and T6 provide the output level and not the magnitude of input signal level, by adding pseudo signal to the input signal. Moreover, this permits utilization of a lower gain amplifier with its inherent wider band width and smaller offset unbalances.

It should be obvious to one skilled in the art that the pulse current source 16 is utilized only when the input transistors T1 and T2 are inherently imbalanced. If all transistors are balanced one to the other, an ordinary current source can be employed in place of the pulse current source 16.

The invention requires a DC amplifier, where the output voltage level is not greatly different from the input voltage level, but it may be used with inverting or non-inverting amplifiers by merely adjusting the phase of T5-T6 transistor bases by cross coupling or direct coupling.

The following invention has been particularly shown and described in the described embodiments thereof. It will be understood by those skilled in the art that various changes in form or detail may be made therein without departing from the spirit and scope of the invention.

What is claimed is:

1. A latched negative feedback differential amplifier having increased gain and polarity reversal comprising:
   a differential amplifier having first and second input lines and first and second output lines,
   first impedance means coupling said first input line to said first output line,
   second impedance means coupling said second input line to said second output line, and
   a pair of emitter coupled latch transistors, each of said pair of transistors having an input and an output,
   each of said latch transistors having its input coupled to a respective output line and its output coupled to a respective input line to latch and amplify an input signal applied to said amplifier.

2. The amplifier of claim 1 wherein the emitters of said emitter coupled latch transistors are coupled to a pulsed current source.

3. The amplifier of claim 2 wherein said first and said second impedance means comprise resistors.

4. The amplifier of claim 3 wherein said amplifier further comprises a pair of emitter coupled input transistors, each of said input transistors having an input and an output with each of said input transistors having its input coupled to a respective input line and its output coupled to the input of a respective emitter follower transistor; the emitter of each of said emitter follower transistors being coupled to a respective output line.

5. A differential amplifier having a latched positive feedback to increase gain which comprises:
   an emitter coupled pair of input transistors, each having a base coupled to a respective input line,
   a pair of output transistors, each having a base coupled to the collector of a respective one of said input transistors and an emitter coupled to a respective output line,
   a second pair of emitter coupled feedback transistors each having a base coupled to a respective one of said input lines through a resistor and directly to one of said output lines and a collector coupled to a respective input line to provide positive feedback to and add signal to the input of the amplifier causing an increase in gain and polarity reversal to latch the amplifier at its input.

6. A circuit comprising
   a first input transistor having a collector, a base and an emitter,
   a second input transistor having a collector, a base and an emitter in common with the emitter of the first input transistor,
   a first emitter follower having an emitter, a base and a collector,
   a second emitter follower transistor having a base, an emitter and a collector in common with the first emitter follower transistor,
   a first latch transistor having a collector, a base and an emitter, a second latch transistor having a collector, a base and an emitter in common with the emitter of the first latch transistor, the collector of said first input transistor being connected to the base of said first emitter follower transistor, the emitter of said first emitter follower transistor being coupled to a first output line, to the base of said first latch transistor and through a resistive impedance to a first input line, the base of said first input transistor and the collector of the first latch transistor, the collector of said second input transistor being coupled to the base of said second emitter follower transistor, the emitter of the said second emitter follower transistor being coupled to a second output line, to the base of said second latch transistor and through a resistive impedance to a second input line, the base of said second input transistor and the collector of the second latch transistor, the emitters of said input transistors being coupled through a current source to ground, the emitters of said latch transistors being coupled to a current source to ground and the common collectors of said emitter follower transistors being coupled to a voltage source.

* * * * *